United States Patent [19]

Laskaris

[11] Patent Number: 4,467,303
[45] Date of Patent: Aug. 21, 1984

[54] SUPERCONDUCTING MAGNET HAVING A SUPPORT STRUCTURE FOR RING-SHAPED SUPERCONDUCTIVE COILS

[75] Inventor: Evangelos T. Laskaris, Schenectady, N.Y.

[73] Assignee: General Electric Company, Schenectady, N.Y.

[21] Appl. No.: 472,706

[22] Filed: Mar. 7, 1983

[51] Int. Cl.³ .............................................. H01F 7/22
[52] U.S. Cl. .................................. 335/216; 174/126 S
[58] Field of Search ............................. 335/216, 300; 174/126 S, 128 S

[56] References Cited

U.S. PATENT DOCUMENTS

| 3,514,730 | 5/1970 | Kassner | 335/216 |
| 3,559,126 | 1/1971 | Drautman | 335/216 |
| 3,991,333 | 11/1976 | Laskaris | 310/52 |
| 4,333,228 | 6/1982 | Koch | 335/216 X |

OTHER PUBLICATIONS

J. E. C. Williams et al., "Magnet System of the 500 MHz NMR Spectrometer at the Francis Bitter National Magnet Laboratory: I. Design and Development of the Magnet", Rev. Sci. Instrum., vol. 52, No. 5, (May 1981), pp. 649–656.
J. E. C. Williams et al., "Magnet System of the 500 MHz NMR Spectrometer at the Francis Bitter National Magnet Laboratory: II, Disturbances, Quenches and Trailing", Rev. Sci. Instrum., vol. 52, No. 5, (May 1981), pp. 657–661.

*Primary Examiner*—George Harris
*Attorney, Agent, or Firm*—Lawrence D. Cutter; James C. Davis, Jr.; Marvin Snyder

[57] ABSTRACT

A superconducting magnet includes a coil support structure comprising a body formed of a generally-cylindrical wall. The body includes at least a pair of surfaces facing inwardly of said body, each being of generally-cylindrical shape and each being adapted to abut the radially-outer surface of a respective one of a pair of ring-shaped, superconductive coils. The support structure comprises a material such as aluminum which is adapted to shrink around the coils as the body and coils are cooled to a cryogenic temperature, so as to provide interference fits between the body and the coils. To prevent movement of the coils towards each other due to magnetic attraction forces therebetween, the body includes a pair of shoulders extending inwardly from respective adjacent edges of the pair of inwardly-facing surfaces. The shoulders are adapted to abut confronting surfaces of the pair of coils to prevent the coils from moving towards each other.

19 Claims, 7 Drawing Figures

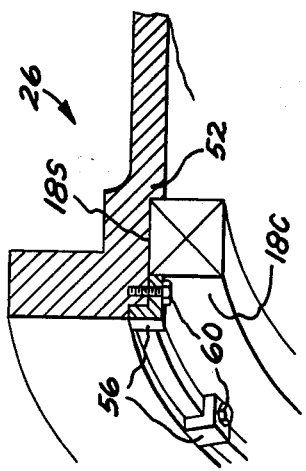
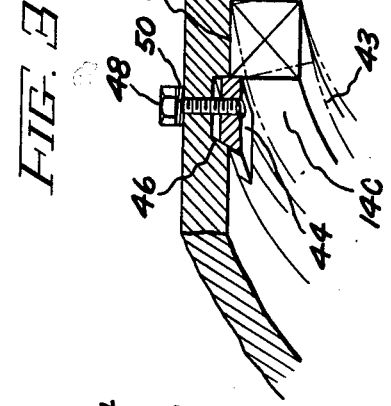
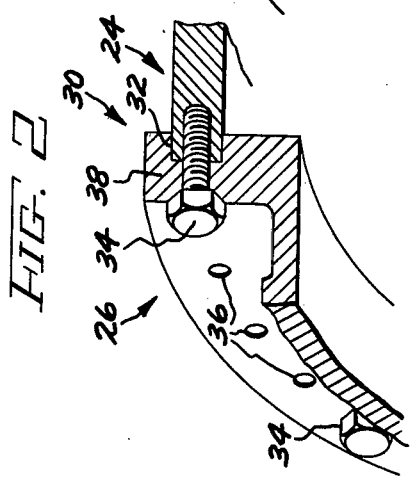
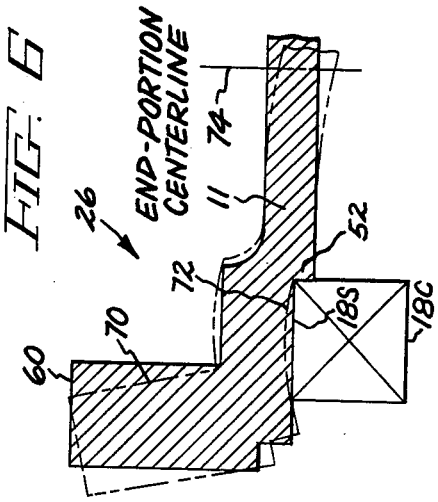
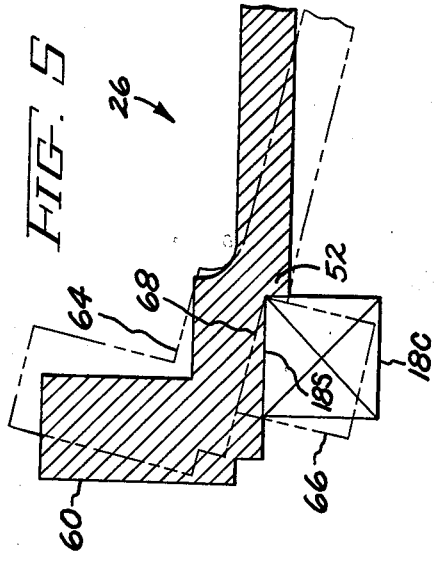

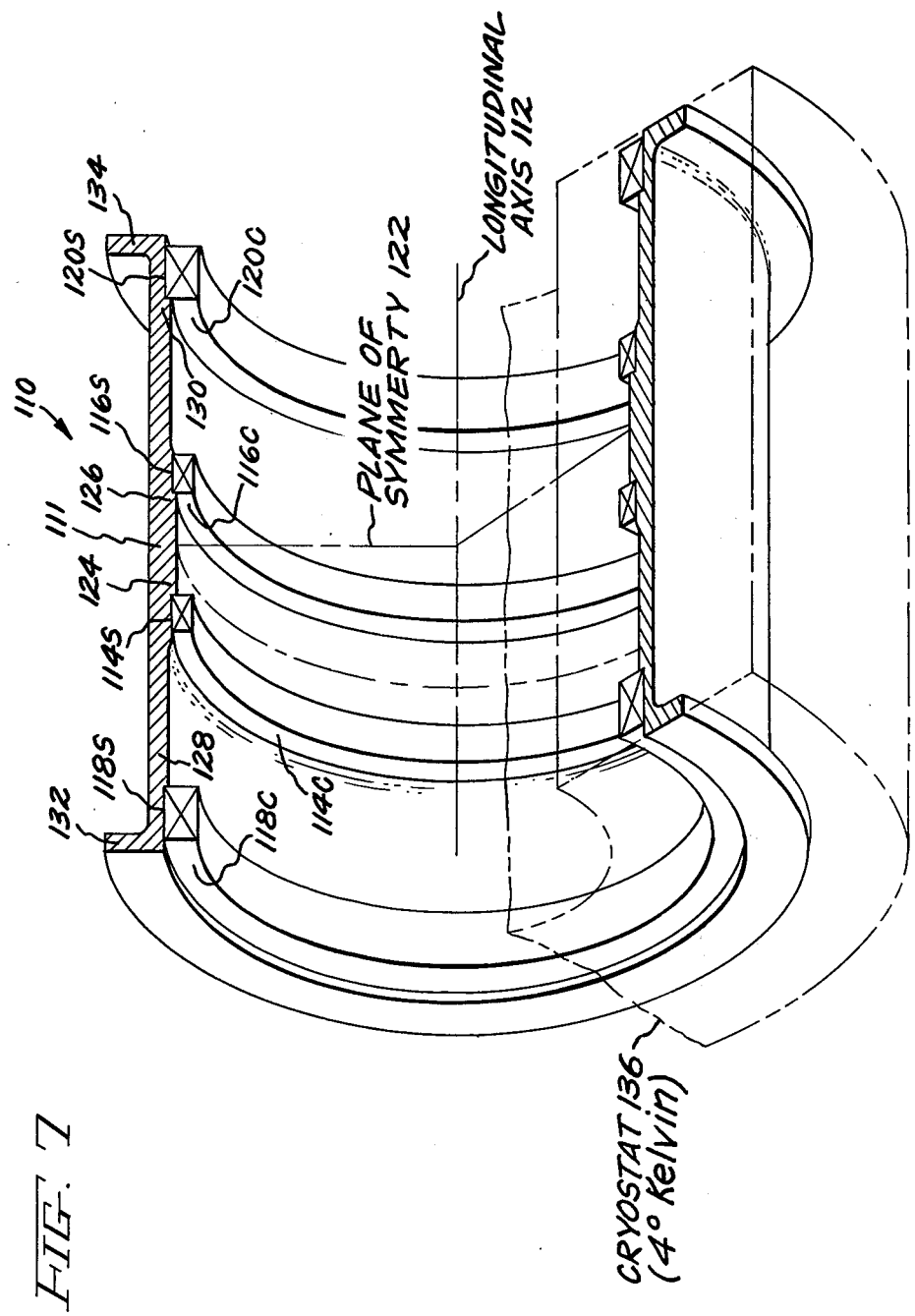

SUPERCONDUCTING MAGNET HAVING A SUPPORT STRUCTURE FOR RING-SHAPED SUPERCONDUCTIVE COILS

BACKGROUND OF THE INVENTION

My invention relates to superconducting magnets, and more particularly to support structures for ring-shaped superconductive coils.

A plurality of ring-shaped superconductive coils having a common longitudinal axis are useful in establishing a large magnetic field, aligned with such longitudinal axis, in the vicinity of the axis. Such a magnetic field is required, for example, in nuclear magnetic resonance (NMR) imaging apparatus. In such apparatus, the subject of inquiry, such as an entire human body, is placed in the region of high magnetic field and exposed to selected radio-frequency electromagnetic waves. The atoms of the human body re-emit radio-frequency electromagnetic waves at different frequencies depending on the identity of the atoms. Detection of such different frequencies reveals the identity of the atoms, and this information is used to generate images of internal body structures.

Superconductive coils must be maintained below a critical, extremely low temperature, typically about 4° Kelvin (i.e., 451° Farenheit below zero) in order to be superconducting. When superconducting, these coils are capable of carrying electric current at an extremely high density, permitting the attainment of extremely high magnetic fields. Any heating of a superconducting coil that raises the temperature of even a single, localized part of the coil above the critical temperature results in the entire coil losing superconductivity due to rapidly spreading $I^2R$ or resistive heating of the coil.

A ring-shaped superconductive coil typically comprises a winding of superconductive wire impregnated with epoxy so as to form a monolithic structure. The epoxy-impregnation in large measure prevents relative movement between the individual wires of the winding that would give rise to undesirable frictional heat generation.

Heat generation in a superconductive coil can also result from interaction of the coil and its support structure which maintains the coil in a desired position. A first component of such heat generation is the frictional heat generated from relative sliding movement between the coil and the support structure. A second component of such heat generation results from relative movement of internal coil strands, typically transitory and of minute magnitude, which is induced from high stress in the winding, either compressional or tensile in nature. These transient movements give rise to a phenomenon known in the art as "training" of the coil. A coil in the process of training experiences interior movement during coil energization, even though it is epoxy-impregnated. Such movement causes the coil to become frictionally-heated above the critical temperature and lose superconductivity at a lower than rated current density, and also requires cessation of current therethrough to avoid excessive resistive heating of the coil. Upon cooling of the coil below the critical temperature and reenergization thereof, it typically experiences further interior coil movement, although usually less pronounced, again resulting in frictional heating of the coil above the critical temperature; however, this occurs at a higher current density if the interior coil movement is less. Cycles of cooling and reenergization of the coil continue, with the coil attaining higher current densities as interior coil movement subsides. In this way, coils are "trained" to withstand the high stresses imposed upon them, although such training is not always permanent.

Training of a coil is not without considerable costs arising, for example, from the required cycles of coil cooldown and reenergization. Additionally, the container in which the cooling medium for the coil (i.e., the cryostat) is located must be designed to withstand repeated heating and pressure cycles, so as to prevent loss of cooling medium. Thus, it would be desirable to provide a coil support structure that interacts with a coil in such a way as to reduce stresses in the coil that would require training of the coil.

A commercially-available superconducting magnet including ring-shaped superconductive coils utilizes a support structure comprising an aluminum body of generally-cylindrical shape and which has outwardly-opening recesses extending around the circumference thereof. Ring-shaped superconductive coils are manufactured in the recesses by winding superconductive wire directly into the recesses and then impregnating the resulting winding with epoxy. These coils, however, are undesirably subject to two different sources of heating, both arising from the fact that a ring-shaped superconductive coil tends to expand in diameter upon energization. One potential source of heating constitutes relative sliding movement between the axial sides of the coil and the adjacent walls of the recess in which the coil is formed. Another potential source of heating results from the high tensile stresses that arise in the expanded coil and undesirably may require that the coil be trained.

SUMMARY OF THE INVENTION

Accordingly, it is an object of my invention to provide a superconducting magnet including a support structure for ring-shaped superconductive coils wherein relative sliding motion between the coils and the support structure is greatly reduced.

Another object of my invention is to provide a superconducting magnet including a support structure for ring-shaped superconductive coils wherein stresses in the coil are reduced to such a degree that the need for training of the coils is substantially eliminated.

In accordance with a preferred embodiment of my invention, I provide a superconducting magnet in which support structure for ring-shaped superconductive coils comprises a body formed of a generally-cylindrical wall. The body includes at least first and second inwardly-facing surfaces of generally-cylindrical shape, which are adapted to abut the radially-outer surfaces of first and second ring-shaped superconductive coils, respectively. The support structure body comprises a material such as aluminum which is adapted to shrink around the first and the second coils as the body and coils are being cooled to a cryogenic temperature. Consequently, interference fits between the body and the coils are provided. To prevent the first and second coils from moving towards each other due to electromagnetic attraction forces between these coils, the body includes first and second shoulders extending inwardly from the adjacent edges of the first and second surfaces, respectively. These shoulders are adapted to abut the adjacent surfaces of the first and second coils so as to restrain movement of the coils towards each other.

In practice I have found that there is very little movement, if any at all, between the coils and the support structure, inasmuch as the coils have not lost superconductivity despite repeated energization. Additionally, the coils do not require training to reach their rated current. This apparently is because the compressional forces exerted on the coils by the support structure substantially counterbalance the tensile forces that would otherwise tend to arise in the coils upon their being energized.

BRIEF DESCRIPTION OF THE DRAWINGS

The features of the invention believed to be novel and unobvious over the prior art are set forth with particularity in the appended claims. The invention itself, however, as to organization and particulars of operation, together with further objects and advantages thereof, may be best understood with reference to the following description when considered in conjunction with the accompanying drawings, in which:

FIGS. 2-4 are enlarged detail views of particular features of the support structure of FIG. 1;

FIGS. 5 and 6 are greatly enlarged detail views of particular features of the support structure of FIG. 1; and FIG. 7 is a perspective view of a support structure for ring-shaped superconductive coils in accordance with a further embodiment of my invention, with a portion of the support structure removed to facilitate understanding of details thereof.

DESCRIPTION OF THE PREFERRED EMBODIMENTS

Figure 1:
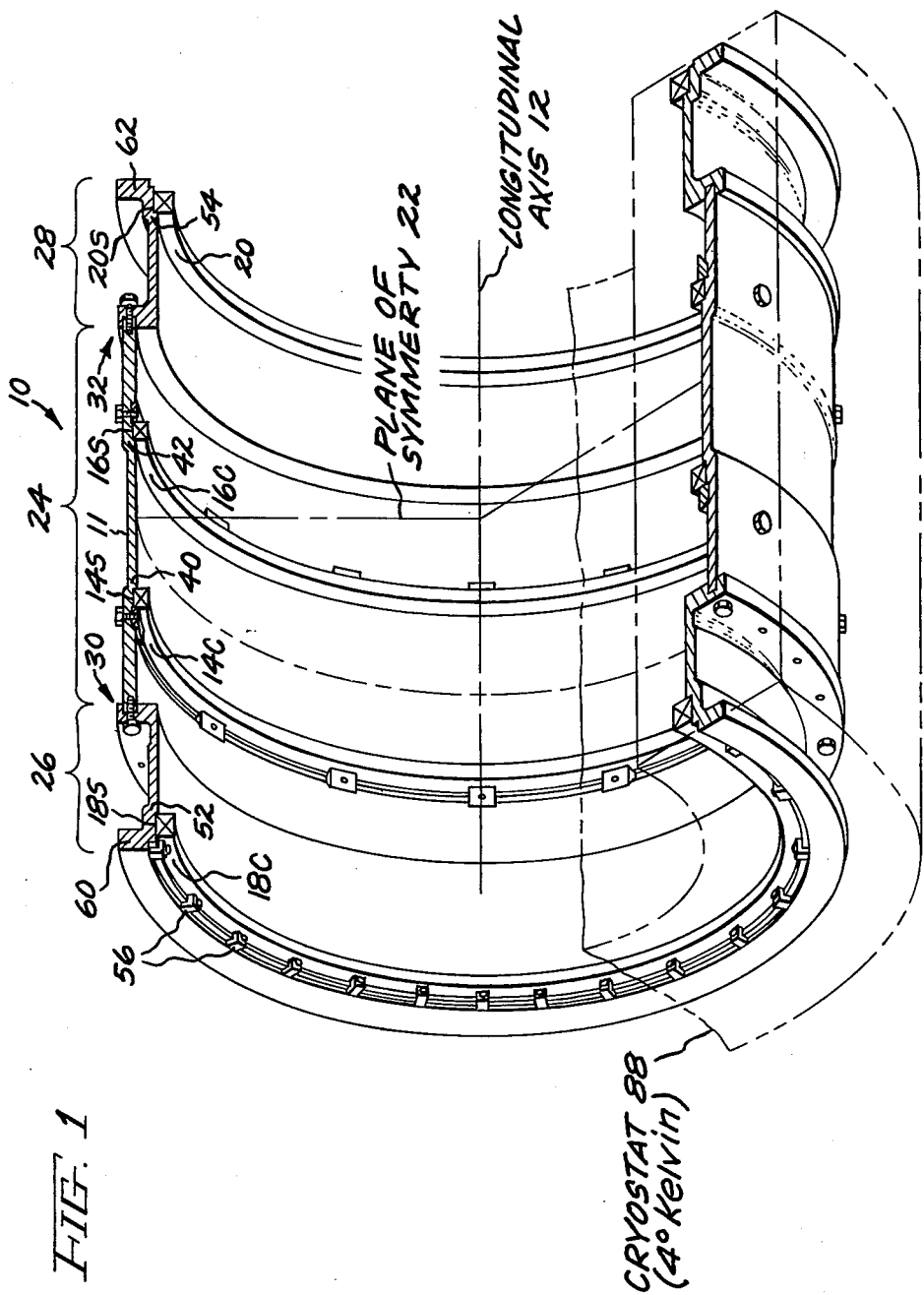
FIG. 1 is a perspective view of a support structure for ring-shaped superconductive coils in accordance with my invention, with a portion of the support structure removed to facilitate understanding of details thereof.

FIG. 1 illustrates a preferred support structure in accordance with my invention. The support structure comprises a body 10 formed of a generally-cylindrical wall 11, a longitudinal axis 12 being located inwardly of body 10. Also illustrated in FIG. 1, in schematic form, are the following ring-shaped superconductive magnet coils: axially-inner coils 14C and 16C, and axially-outer coils 18C and 20C. Body 10 includes inwardly-facing surfaces 14S, 16S, 18S and 20S, each of a generally-cylindrical shape, preferably as close to being exactly cylindrical as possible, which surfaces abut the radially-outer surfaces of coils 14C, 16C, 18C and 20C, respectively. Body 10 is comprised of a nonmagnetic material selected to shrink as it is cooled to a cryogenic temperature, which depends upon the properties of the coils (typically about 4° Kelvin for niobium-titanium superconductors), so as to provide interference fits between body 10 and the coils.

Due to the interference fits between body 10 and coils 14C, 16C, 18C and 20C, I have found that, during operation, the hoop stress in each coil is markedly reduced from what it would be if the coils were not restrained by interference fits with body 10 such as describes the prior art structure discussed above. This can be quantitatively appreciated as follows. In the absence of coil energization, for a superconducting magnet with a magnetic field intensity of 0.8 Tesla and a current density through the aggregate cross-sections of the coils of 30,000 amps/cm$^2$, (hereinafter, "0.8 Tesla magnet"), the compressional stress on the coils, resulting from the interference fit of body 10, is approximately 12,000 psi at 4° Kelvin. Upon coil energization, however, the coils tend to expand, giving rise to a tensile hoop stress in the coils, which, to a high degree, counteracts the compressional stress due to the interference fit. The net stress on the coils comprises a compressive hoop stress of only about 3,000 psi.

Aluminum is particularly preferred for body 10, because the coils can then be readily inserted into body 10 of aluminum at room temperature, and then cooled to a cryogenic temperature to provide interference fits with the coils. Nonmagnetic materials other than aluminum can be utilized, however, such as copper, brass, bronze or fiberglass. The use of any of these alternative materials for body 10, however, typically requires that the coils be inserted into body 10 at a temperature considerably higher than room temperature, inasmuch as these materials shrink less than does aluminum for the same drop in temperature.

In order to achieve a high homogeneity of magnetic field in the vicinity of longitudinal axis 12, it is desirable that support structure body 10 be symmetrical about a plane of symmetry 22 located orthogonal to longitudinal axis 12. Thus, for example, axially-inner coil 14C is symmetrically positioned with respect to axially-inner coil 16C, and axially-outer coil 18C is symmetrically positioned with respect to axially-outer coil 20C. While support structure body 10, as illustrated, is designated to accommodate four coils (i.e. coils 14C, 16C, 18C and 20C) it could accommodate other symmetrically arranged numbers of coils. By way of example, a further coil could be positioned directly on plane of symmetry 22, or a pair of additonal coils could be provided which are spaced symmetrically about plane of symmetry 22. Other variations will be apparent to those skilled in the art.

Body 10 comprises mid-section 24 and end-sections 26 and 28, which are tightly joined to mid-section 24, as with rabbet joints 30 and 32, respectively. As can best be seen in the detail view of FIG. 2, rabbet joint 30 comprises the left axial end of mid-section 24 inserted into an axially-opening groove or rabbet 32 in end-section 26 and secured in rabbet 32, as with, preferably a plurality of bolts 34, extending from flange 38 of end-section 26 into the left axial end of mid-section 24, and, further, preferably a plurality of alignment pins 36 similarly extending from flange 28 into mid-section 24. In addition to providing rabbet 32 for implementing rabbet joint 30, outwardly-extending flange 38 also provides added structural rigidity to end section 26 which is useful in maintaining the cylindrical shape of end-section 26, whereby high magnetic homogeneity is maintained in the vicinity of longitudinal axis 12.

To prevent inner coils 14 and 16, shown in FIG. 1, from movement towards each other due to electromagnetic attraction forces therebetween, which typically exceed 10,000 pounds for a 0.8 Tesla magnet, shoulders 40 and 42 of body mid-section 24 extend inwardly from adjacent edges of first and second surfaces 14S and 16S, respectively. As best illustrated in the detail view of FIG. 3, shoulder 40 thereby overlaps coil 14C for a short distance, preventing movement to the right of coil 14C. With coil 14C overlapping such a short projection 40, it may be thought that coil 14C would rotate to the position shown in phantom at 43, due to the electromagnetic attraction forces pulling coil 14C to the right. However, in a 0.8 Tesla magnet, I have found this not to be the case, apparently due to the tight interference fit between body surface 14S and coil 14C. To ensure that coil 14C tightly abuts shoulder 40, a series of wedges 44 are disposed within inwardly-opening recess 46 of body mid-section 24, spaced along the circumference thereof. Wedge 44 is retractable into recess 46, for example, by means of a bolt 48 threaded into wedge 44 from the outer surface of mid-section 24. Wedge 44 can be retracted into recess 46 by turning bolt 48 in an appropriate direction. This causes wedge 44 to press against coil 14C and push it tightly against shoulder 40. A belleville or spring-like washer 50 is preferably provided around bolt 48 to allow wedge 44 freedom of movement during any transient movement of coil 14C while it is being cooled down to a cryogenic temperature.

By tightly pressing coil 14C against shoulder 40, wedge 44 (FIG. 3) prevents undesirable movement between surface 14S and coil 14C, and also prevents the buildup of high shear stress therebetween. Advantageously, bolt 48 can be turned so as to retract wedge 44 into recess 46 after support structure body 10 is assembled.

Considering again FIG. 1, support structure end-sections 26 and 28 include inwardly-extending shoulders 52 and 54, repectively, for restraining the respective coils 18C and 20C from movement towards each other due to electromagnetic attraction forces therebetween. Shoulders 52 and 54 are essentially similar in construction to shoulders 40 and 42, discussed above. To hold coil 18C tightly against shoulder 52, a plurality of L-shaped backets 56 are provided, as best illustrated in the detail view of FIG. 4. As shown in FIG. 4, brackets 56 are secured to the inner surface of body end-section 26, such as with bolts 60.

Referring back to FIG. 1, the wall of support structure body 10 in the vicinity of surfaces 14S, 16S, 18S and 20S should be varied in thickness along longitudinal axis 12 so as to maintain substantially unchanged the configuration of these surfaces during cooldown of body 10 to a cryogenic temperature. This is necessary to prevent distortion of the coils and resultant high stresses in the coils. Distortion of the axially-outer coils, for example coil 18C, can be substantially eliminated by including flange 61 in support structure end-section 26, which can be better appreciated by considering the detail view of FIG. 5, illustrating in enlarged form flange 61 and coil 18C. Flange 61 advantageously prevents end portion 26 from contracting during cooldown in such a way that it would tend to become distorted in shape as shown in phantom at 64, with coil 18C likewise tending to become distorted in shape as shown in phantom at 66, because coil 18C would be forced to assume the shape of surface 68. The inclusion of flange 61 in end-section 26 markedly reduces such distortion of coil 18C from occurring, because the large effective mass of flange 61 results in the illustrated portion of end-section 26 (FIG. 5) contracting at the same rate at its left side as at its right side.

As mentioned in the foregoing discussion, the provision of flange 61 in end-section 26 (FIG. 1) markedly reduces distortion of coil 18C. However, as illustrated in the enlarged, detail view of FIG. 6, end-section 26 still tends to contract upon cooldown in such a way as to tend to become distorted in shape to the position shown in phantom at 70, since the portion of wall 11 in the vicinity of surface 18S is not rigid enough to fully prevent such distortion. Accompanying this distortion, the configuration of surface 18S tends to change to that shown in phantom at 72. This results in compressional stresses on coil 18C that are maximum at its upper right portion and at its upper left portion, as viewed in FIG. 6. To hold this unfavorable result to within innocuous limits, the thickness of wall 11 of end-section 26 should be varied along longitudinal axis 12 (FIG. 1) so as to minimize the disparity between distorted surface 72 and surface 18S. Specifically, the thickness of the wall of end-section 26 should, in general, increase from centerline 74 of end-section 26 (FIG. 6) to the left, as viewed in FIG. 6. From viewing end-section 26 as depicted in FIG. 6, it can be appreciated that flange 61 constitutes a portion of wall 11 of end-section 26 that is considerably greater in thickness than the illustrated portions of end-section 26 to the right of flange 61. In particular the portion of wall 11 of end-section 26 that extends radially-outwardly from surface 18S is thicker than the portion of wall 11 at the centerline 74 of end-portion 26.

Referring again to FIG. 1, it is desirable that the portions of wall 11 of mid-section 24 in the vicinities of surfaces 14S and 16S, respectively, be varied along longitudinal axis 12 so as to maintain substantially unchanged the configuration of surfaces 14S and 16S during cooldown of mid-section 24 to a cryogenic temperature. Considering surface 14S, for instance, it can be seen that the thickness of the portion of wall 11 of mid-section 24 immediately radially-outwardly from surface 14S is greater in thickness than the portion of wall 11 of mid-section 24 near the center thereof (i.e., near plane of symmetry 22).

In order to enable superconducting coils 14C, 16C, 18C and 20C to be cooled to a cryogenic temperature, such as 4° Kelvin, support structure body 10 is placed in a cryostat 88 (shown diagrammatically and partially broken away), in which the coils, along with body 10, are entirely immersed in a coolant such as liquid helium. Body 10 can be suitably secured to the housing (not shown) of cryostat 88 as by attaching end flanges 60 and 62 thereto.

Support structure body 10 is especially adapted for use where axially-inner coils 14C and 16C are larger in outside diameters than axially-outer coils 18C and 20C. This is because body end-sections 26 and 28 are separable from mid-section 24 in order to permit insertion of inner coils 14C and 16C into mid-section 24 prior to the attachment of end-sections 26 and 28 onto mid-section 24. Where, however, it is desired to support axially-outer coils larger in outside diameters than axially-inner coils, a support structure 110 as shown in FIG. 7, may advantageously be utilized.

Referring now to FIG. 7, it can be seen that body 110 comprises a unitary body formed of a generally-cylindrical wall 111, with a longitudinal axis 112 being located inwardly of body 110. Ring-shaped coils 114C, 116C, 118C and 120C are supported in body 110 through interference fits with body surfaces 114S, 116S, 118S and 120S, respectively. To obtain the maximum homogeneity of magnetic field in the vicinity of longitudinal axis 112, it is preferably that body 110 be symmetrical about a plane of symmetry 122 orthogonal to longitudinal axis 112.

Body 110 includes shoulders 124 and 126 restraining motion of coils 114C and 116C towards each other, and similarly includes shoulders 128 and 130 restraining motion of coils 118C and 120C towards each other.

In contrast to the embodiment of FIG. 1, the thickness of wall 111 of body 110 in the vicinity of surface 114S is not greater than the thickness of such wall in the vicinity of line of symmetry 122. This is because wall 111 of body 110 is considerably thicker than wall 11 of body 10 (FIG. 1), resulting in surface 114S remaining substantially unchanged in shape during cooldown of body 110 to a cryogenic temperature. With regard to surface 118S, on the other hand, the thickness of the wall in the vicinity thereof does increase to the left along longitudinal axis 112, as viewed in FIG. 7. That is, flange 132 constitutes a portion of wall 111 with greater thickness than the portion of wall 111 near plane of symmetry 122. Flange 132 is instrumental in maintaining substantially unchanged the configuration of surface 118S during cooldown of body 110 to a cryogenic temperature. Flange 134 of body 120 similarly maintains the configuration of surface 120S substantially unchanged, inasmuch as flange 134 is symmetrical to flange 132, at least in the preferred embodiment.

To cool to a cryogenic temperature coils 114C, 116C, 118C and 120C and also body 110, a cryostat 136, shown in diagrammatic form, is utilized.

The foregoing desribes support structures for ring-shaped superconducting magnet coils that greatly reduce sliding motion between the coils and support structure, and that, further, substantially eliminate high stresses in the coils that would give rise to the necessity of training the coils. Additionally, the support structures interact with the coils in such a way as to minimize distortion of the coils that would give rise to inhomogeneities of the magnetic field induced within the ring-shaped coils.

While my invention has been described with respect to specific embodiments, many modifications and substitutions thereof will be apparent to those skilled in the art. It is, therefore, to be understood that the appended claims are intended to cover all such modifications and substitutions as fall within the true spirit and scope of the invention.

What I claim as my invention and desire to have secured by Letters Patent of the United States is:

1. A superconducting magnet comprising:
   at least one ring-shaped superconductive coil; and
   a support structure for said coil including a body formed of a generally-cylindrical wall, said body having a first inwardly-facing surface which is of a generally-cylindrical shape and which is adapted to abut the radially-outer surface of said coil;
   said body comprising a material adapted to shrink around said coil as said coil and said body are cooled to a cryogenic temperature so as to provide an inteference fit between said coil and said body.

2. The superconducting magnet of claim 1 wherein said body includes an outwardly-extending flange proximate said first surface for maintaining substantially unchanged the configuration of said first surface during cooldown of said body to a cryogenic temperature.

3. The superconducting magnet of claim 1 including a second, ring-shaped superconductive coil, and wherein said body further includes:
   a second inwardly-facing surface symmetrical to said first surface, spaced along the longitudinal axis of said body from said first surface and adapted to abut the radially-outer surface of said second coil; and
   first and second shoulders extending radially inwardly of said body from adjacent edges of said first and second surfaces, respectively, said first and second shoulders being adapted to abut adjacent surfaces of said first and second coils, respectively.

4. The superconducting magnet of claim 3 wherein said body further includes means for preloading said first and second coils towards each other and against said first and second shoulders, respectively.

5. The superconducting magnet of claim 4 wherein said means for preloading said first and second coils towards each other comprises:
   first and second inwardly-opening recesses in said body located on respective axially distal sides of said first and second surfaces; and
   at least one wedge situated in each of said first and second inwardly-opening recesses and which is retractable thereinto, said wedge and said respective recess being so configured and arranged as to press the respective first or second coil towards the adjacent first or second shoulder, respectively, when said wedge is retracted into said respective recess.

6. The superconducting magnet of claim 1 wherein said body comprises aluminum.

7. A superconducting magnet comprising:
   at least first, second, third and fourth ring-shaped superconductive coils; and
   a support structure for said coil including a body formed of a generally-cylindrical wall, said body having a mid-section and first and second end-sections separably joined thereto;
   said mid-section including first and second inwardly-facing surfaces of generally-cylindrical shape and adapted to abut the radially outer surfaces of said first and second coils, respectively;
   said first and second end-sections respectively including third and fourth inwardly-facing surfaces of generally-cylindrical shape and adapted to abut the radially-outer surface of said third and fourth coils, respectively; and
   said body comprising a material adapted to shrink around said first, second, third and fourth coils as said coils and said body are cooled to a cryogenic temperature so as to provide respective interference fits between said coils and said body.

8. The superconducting magnet of claim 7 wherein said body further includes:
   first and second shoulders extending radially inwardly of said body from adjacent edges of said first and second surfaces, respectively; said first and second shoulders being adapted to abut adjacent surfaces of said first and second coils, respectively; and
   third and fourth shoulders extending radially inwardly of said body from adjacent edges of said third and fourth surfaces, respectively; said third and fourth shoulders being adapted to abut adjacent surfaces of said third and fourth coils, respectively.

9. The superconducting magnet of claim 8 wherein said body further includes means for preloading said first and second coils towards each other and against said first and second shoulders, respectively.

10. The superconducting magnet of claim 9 wherein said means for preloading said first and second coils towards each other comprises:
    first and second inwardly opening recesses in said body located on respective axially distal sides of said first and second surfaces; and
    at least one wedge situated in each of said first and second inwardly-opening recesses and which is retractable thereinto, said wedge and said respective recess being so configured and arranged as to press the respective first or second coil towards the adjacent first or second shoulder, respectively, when said wedge is retracted into said respective recess.

11. The superconducting magnet of claim 7 wherein said first and second surfaces are of larger diameters than said third and fourth surfaces.

12. The superconducting magnet of claim 7 wherein said mid-section includes a generally-cylindrically-shaped wall situated between said first and second surfaces, the wall of said mid-section in the immediate vicinity of each of said first and second surfaces being thicker than the wall of said mid-section midway between said first and second surfaces.

13. The superconducting magnet of claim 7 wherein each of said first and second end-sections includes an outwardly-extending flange situated at one longitudinal end of the respective end-section and a further outwardly-extending flange situated at the other longitudinal end thereof.

14. The superconducting magnet of claim 7 wherein the longitudinal ends of said mid-section are received in rabbets of said first and second end-sections.

15. The superconducting magnet of claim 7 wherein said mid-section and said first and second end-sections each comprise aluminum.

16. A superconducting magnet comprising:
at least four ring-shaped superconductive coils; and
a support structure for said coils including a unitary body formed of a generally-cylindrical wall;
said body including a pair of axially inner, inwardly-facing surfaces of generally cylindrical shape and a pair of axially outer, inwardly-facing surfaces of generally-cylindrical shape, said axially-inner surfaces being of larger diameter than said axially-outer surfaces, said axially-inner and said axially-outer surfaces being adapted to respectively abut the radially outer surfaces of said four coils; and
said body comprising a material adapted to shrink around said four coils as said coils and said body are cooled to a cryogenic temperature so as to provide respective interference fits between said coils and said body.

17. The superconducting magnet of claim 16 wherein said body includes a first pair of shoulders extending inwardly of said body from adjacent edges of said pair of axially-inner surfaces and a second pair of shoulders extending inwardly of said body from adjacent edges of said pair of axially-outer surfaces, each of said pairs of shoulders being adapted to abut adjacent surfaces of a respective pair of axially-inner or axially-outer coils.

18. The superconducting magnet of claim 16 wherein said body includes an outwardly-extending flange situated at one longitudinal end thereof and a further outwardly-extending flange situated at the other longitudinal end thereof.

19. The superconducting magnet of claim 16 wherein said body comprises aluminum.

* * * * *